(12) United States Patent
Fehr et al.

(10) Patent No.: US 6,804,851 B2
(45) Date of Patent: Oct. 19, 2004

(54) HOLDER FOR SEMICONDUCTOR WAFERS IN A BRUSH-CLEANING INSTALLATION

(75) Inventors: Matthias Fehr, Pulsnitz (DE); Rüdiger Hunger, Radeberg (DE); Thomas Mieth, Dresden (DE)

(73) Assignee: Infineon Technologies AG, Munich (DE)

( * ) Notice: Subject to any disclaimer, the term of this patent is extended or adjusted under 35 U.S.C. 154(b) by 158 days.

(21) Appl. No.: 10/134,893

(22) Filed: Apr. 29, 2002

(65) Prior Publication Data

US 2002/0160701 A1 Oct. 31, 2002

(30) Foreign Application Priority Data

Apr. 28, 2001 (DE) ......................................... 101 21 010

(51) Int. Cl.[7] ............................................. A47L 15/00
(52) U.S. Cl. ............................ 15/77; 15/88.3; 134/153; 134/902
(58) Field of Search ................................ 451/283, 385, 451/364, 36; 15/77, 88.3; 134/153, 902; 269/57

(56) References Cited

U.S. PATENT DOCUMENTS

| 5,052,886 | A |   | 10/1991 | Moroi |
| 5,498,199 | A |   | 3/1996 | Karlsrud et al. |
| 5,647,789 | A | * | 7/1997 | Kitta et al. ................... 451/41 |
| 5,703,493 | A | * | 12/1997 | Weeks et al. ............... 324/755 |
| 6,454,516 | B1 | * | 9/2002 | Yamagishi ................... 414/754 |

FOREIGN PATENT DOCUMENTS

EP   1 046 464 A1   10/2000

* cited by examiner

Primary Examiner—Deborah Jones
Assistant Examiner—Abraham Bahta
(74) Attorney, Agent, or Firm—Laurence A. Greenberg; Werner H. Stemer; Ralph E. Locher

(57) ABSTRACT

A holder in a brush-cleaning installation, preferably for combined use in the brush-cleaning and centrifugal-drying process, contains a carrier part from which there extend, in a spider-shaped manner, a plurality of carrying arms. On the carrying arms there is mounted, in a rotatable manner in each case, a guide roller which, in addition to positioning the semiconductor wafer vertically, also makes it possible for the semiconductor wafer to be positioned horizontally with the aid of an annular collar on a bottom section of the guide roller.

5 Claims, 4 Drawing Sheets

HOLDER FOR SEMICONDUCTOR WAFERS IN A BRUSH-CLEANING INSTALLATION

BACKGROUND OF THE INVENTION

Field of the Invention

The invention relates to a holder for a flat wafer, in particular a semiconductor wafer in an apparatus for cleaning a semiconductor surface with the aid of brushes. The holder contains a carrier part, a plurality of carrying arms, which extend in a spider-like manner from the carrier part, a plurality of bearing devices, which are intended for positioning the wafer horizontally and are each assigned to a carrying arm, and a plurality of guide rollers, which are intended for positioning the wafers vertically and are each mounted rotatably on the carrying arm.

Such holders are known in general and are used, in particular, for determining the position of the semiconductor wafers for a cleaning and drying process following chemical-mechanical polishing. Chemical-mechanical polishing processes serve, within the context of the production of semiconductor components, for leveling out trench fillings, metal plugs, intermediate oxides or intermetallics. In the case of chemical-mechanical polishing, the semiconductor wafer which is to be processed is forced, by a wafer carrier, against a rotatably disposed polishing table, on which there is located an elastically perforated bearing device containing a polishing material. The semiconductor wafer and polishing table here rotate in opposite directions, as a result of which the protruding locations on the surface of the semiconductor wafer are polished away until a planar wafer surface is achieved.

Following the chemical-mechanical polishing operation, however, impurities remain behind on the surface of the semiconductor wafer, and these have to be removed before the semiconductor wafer is processed further. For this purpose, following the completion of the chemical-mechanical polishing process, the semiconductor wafer is transferred, with the aid of an automatic apparatus, from the polishing installation into a cleaning installation, in which the semiconductor wafer is processed by a brush apparatus, a so-called brush cleaner, in order to free the semiconductor surface of the impurities. During the brush cleaning, the semiconductor surface is flushed continuously with a wetting-agent-containing a cleaning liquid, for example ammonia or distilled water. Following the completion of the brush cleaning, the semiconductor wafer is then freed of the cleaning liquid by centrifugal drying.

The brush cleaning and the centrifugal drying preferably take place here in a combined installation, in order to avoid further transfer of the semiconductor wafer. For the combined brush-cleaning and drying process, the semiconductor wafer is inserted into a holder which, on the one hand, allows the semiconductor wafer to rotate, this being brought about by the rotation of the brushes on the semiconductor surface during the brush-cleaning process, and, on the other hand, makes it possible for the semiconductor wafer to be centrifuged at a high speed during the drying process.

The holder for the semiconductor wafer generally has a turntable from which there extends, in a spider-like manner, preferably four symmetrically disposed carrying arms, on which the semiconductor wafer is seated by way of its outer border. For positioning the semiconductor wafer horizontally on the carrying arms, use is made here of a plastic bearing device at the top ends of the carrying arms, the semiconductor wafer resting thereon. For positioning the semiconductor wafer vertically, guide rollers are provided on the carrying arms. The guide rollers enclose the semiconductor wafer laterally and secure it. The guide rollers are mounted rotatably on the carrying arms in order to make it possible for the semiconductor wafer to rotate during the brush cleaning. The turntable of the holder, furthermore, is driven by a motor in order for it to be possible for the entire holder to execute a rotary movement for the centrifugal drying of the semiconductor wafer following the brush cleaning.

The turntable and the carrying arms of the holder generally are formed of coated steel. However, the process-induced contact with the chemical cleaning agent used during the brush cleaning and also the polishing-material residues from the preceding chemical-mechanical polishing operation, as well as the pronounced mechanical loading as a result of the high speeds during centrifugal drying, give rise to the risk of the coating loosening from the holder elements and of the steel located there-beneath corroding.

In the case of the known holders, the guide rollers for positioning the semiconductor wafer vertically are disposed on accommodating pins, provided on the carrying arms, and are further fixed by plastic plates. The accommodating pins for the guide rollers, like the turntable and the carrying arms of the holder, are produced from coated steel. However, the rotation of the guide rollers during the brush-cleaning process may give rise to abrasion of the coating becoming established, the abrasion resulting in the guide rollers rotating non-uniformly and thus in increased wear. A further problem with the known holders may arise during exchange of the guide rollers since there is a risk, during removal, of the plastic plates damaging the coating of the accommodating pin. Furthermore, the plastics plates can generally only be used once.

The bearing surfaces provided on the carrying arms for positioning the semiconductor wafers horizontally are usually produced from plastic, preferably POM. In the case of the bearing devices, in turn, there is a risk of them breaking up as a result of the continual contact with the cleaning agent used in the brush-cleaning operation and/or the polishing material used in the chemical-mechanical polishing operation, which then results in additional impurities on the semiconductor surface. Since the bearing surfaces on the carrying arms are disposed a fair way in front of the guide rollers, the semiconductor wafer is also supported a fair way inward in the radial direction, with the result that little clearance remains for the brush installation on the holder, which may result in pronounced bending of, and thus damage to, the semiconductor wafer.

U.S. Pat. No. 5,498,199 discloses a holder which is intended for semiconductor wafers in a brush-cleaning installation and in the case of which the bearing device for positioning the semiconductor wafer horizontally and the rotatable guide roller for positioning the same vertically are configured in one piece, this combined positioning configuration being mounted rotatably on a carrying arm with the aid of a ball bearing. The single-piece configuration allows simplified production and reliable mounting of the semiconductor wafers. The disadvantage with this embodiment, however, is the complicated rotary mounting via a ball bearing, which results in high installation and maintenance outlay.

U.S. Pat. No. 5,052,886, furthermore, discloses a bolt mounting for a guide roller, which serves for transmitting a rotary movement from a motor to the guide roller.

SUMMARY OF THE INVENTION

It is accordingly an object of the invention to provide a holder for semiconductor wafers in a brush-cleaning installation which overcomes the above-mentioned disadvantages of the prior art devices of this general type, which is intended for semiconductor wafers in a brush-cleaning installation and is distinguished by ease of maintenance and straightforward installation and, furthermore, reliably avoids damage to, and impurities on, the semiconductor wafer.

With the foregoing and other objects in view there is provided, in accordance with the invention, a holder for a wafer. The holder contains a carrier part, a plurality of carrying arms extending in a spider-shaped manner from the carrier part and each having a bore formed therein, a plurality of bolts, and a plurality of guide rollers for positioning the wafer vertically and each mounted rotatably on one of the carrying arms. Each of the guide rollers has an annular collar for positioning the wafer horizontally. Each of the guide rollers with the annular collar functions as a rotationally symmetrical sleeve having a through-bore formed therein and secured in a rotatable manner on one of the carrying arms by way of one of the bolts disposed in the through-bore. Each of the guide rollers has an underside with an extension resting on one of the carrying arms, the extension having an abutment surface with a diameter being smaller than a diameter of the rotationally symmetrical sleeve to achieve a reduced surface friction. Each of the bolts has a bottom bolt section with a self-securing thread for fastening in the bore on one of the carrying arms, a central bolt section for bearing the rotationally symmetrical sleeve with a sliding action, and a top bolt section with a hat-shape for positioning the rotationally symmetrical sleeve vertically.

The holder according to the invention is for a flat wafer, in particular a semiconductor wafer in an apparatus for cleaning the semiconductor surface with the aid of brushes. The holder is distinguished in that the bearing devices for positioning the semiconductor wafer horizontally are each formed as an annular collar on the guide roller, which is guided rotatably on the carrying arm and serves for positioning the semiconductor wafer vertically.

The single-piece configuration of the bearing device for positioning the semiconductor wafer horizontally and of the rotatable guide roller for positioning the same vertically makes it possible to dispense with a conventional holder component, which results in simplified production and installation. Furthermore, the ease of maintenance of the holder is improved to a considerable extent since, when the guide rollers and the wafer-bearing devices are exchanged, only one component has to be exchanged. As a result, there is a reduction in the maintenance times and thus in the risk of the cleaning brushes drying up when the cleaning installation is at a standstill. Furthermore, the configuration of the wafer-bearing devices as collars on the guide rollers reduces to a considerable extent the abrasion of the wafer-bearing devices, and thus the risk of contamination of the semiconductor surface. Furthermore, configuring the wafer-bearing device as a collar on the guide roller results in that the semiconductor wafer is also only supported radially at the outermost border, with the result that there is a greater amount of clearance on the holder for brush installation, and the risk of the semiconductor wafer bending can thus also be reduced to a considerable extent.

According to the invention, the guide roller with the collar-shaped bearing device is configured as a rotationally symmetrical sleeve with a through-bore, the guide roller being secured on the carrying arm by way of a retaining bolt formed as a pan-head screw with a self-securing thread. This allows straightforward installation and removal of the guide rollers, since all that is required is for the retaining bolt to be removed. The latter, furthermore, can be reused, in particular when, like the carrier part and the carrying arms, it is formed of high-alloy, chemically resistant special steel preferably surface-treated in an electropolishing operation.

Furthermore, the guide roller is configured according to the invention such that disposed on an underside is an extension by way of which the guide roller rests on the carrying arm, the abutment surface of the extension having a diameter which is smaller than the guide-roller diameter, in order to reduce the surface friction upon rotation of the guide roller during the brush-cleaning process. The reduced surface friction, in turn, ensures reduced abrasion of the guide roller and thus a longer service life.

According to a preferred embodiment, the carrier part and the plurality of carrying arms, which extend in a spider-shaped manner from the carrier part, are produced in one piece as a rotationally symmetrical unit from high-alloy chemically resistant special steel, the surface preferably being electropolished. This configuration of the carrying structure of the holder results in that only a single component has to be produced, it being possible to dispense with a coating. This allows the production costs of the holder to be reduced to a considerable extent. Furthermore, this eliminates the risk of abrasion of the coating by the mechanical loading during the brushing and subsequent drying processes as well as chemical removal of the coating by the cleaning agents used during the brush-cleaning process and by the polishing materials previously used during chemical-mechanical polishing.

According to a further preferred embodiment, the surface friction can be further reduced if an extension is also formed on the top side of the guide roller, the extension having the retaining bolt, configured as a pan-head screw, seated on it by way of the underside, and being configured with a diameter which is smaller than the guide-roller diameter. This configuration makes it possible for the risk of abrasion of the guide roller to be reduced and thus both for the service life of the latter to be extended and for additional surface contamination of the semiconductor wafer to be prevented.

According to a further preferred embodiment, there is provided on each carrying arm a horizontal supporting surface on which the guide roller is disposed, there being seated on the supporting surface, radially in front of the guide roller, a bearing device with a stop surface, of which the top side is set back, preferably by at least one millimeter, in relation to the collar-shaped bearing device on the guide roller. The additional bearing device serves as a securing element that allows the semiconductor wafer to be positioned straightforwardly and reliably on the holder, preferably by a robot arm. This is because, if the robot arm does not set down the semiconductor wafer in the desired position, the stop surface of the additional bearing device, as a sliding plane, ensures that the semiconductor wafer automatically slides onto the collar-shaped bearing device on the guide roller. Setting the stop surface of the additional bearing device back in relation to the collar-shaped bearing results in that on the guide roller, at the same time, ensures that there is no contact between the semiconductor wafer and the stop surface when the wafer is located in its desired position on the collar-shaped bearing device on the guide roller.

Other features which are considered as characteristic for the invention are set forth in the appended claims.

Although the invention is illustrated and described herein as embodied in a holder for semiconductor wafers in a brush-cleaning installation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
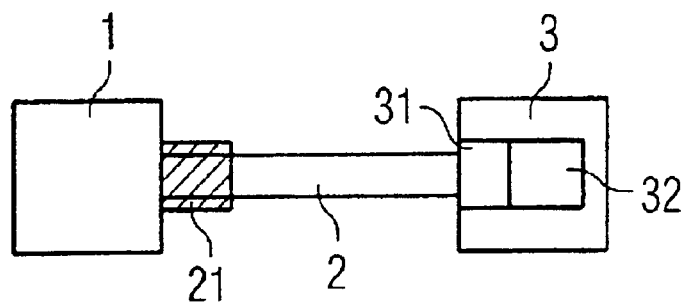
FIG. 1 is a diagrammatic illustration of a chemical-mechanical polishing installation with a connected brush-cleaning installation according to the invention.
Figure 2:
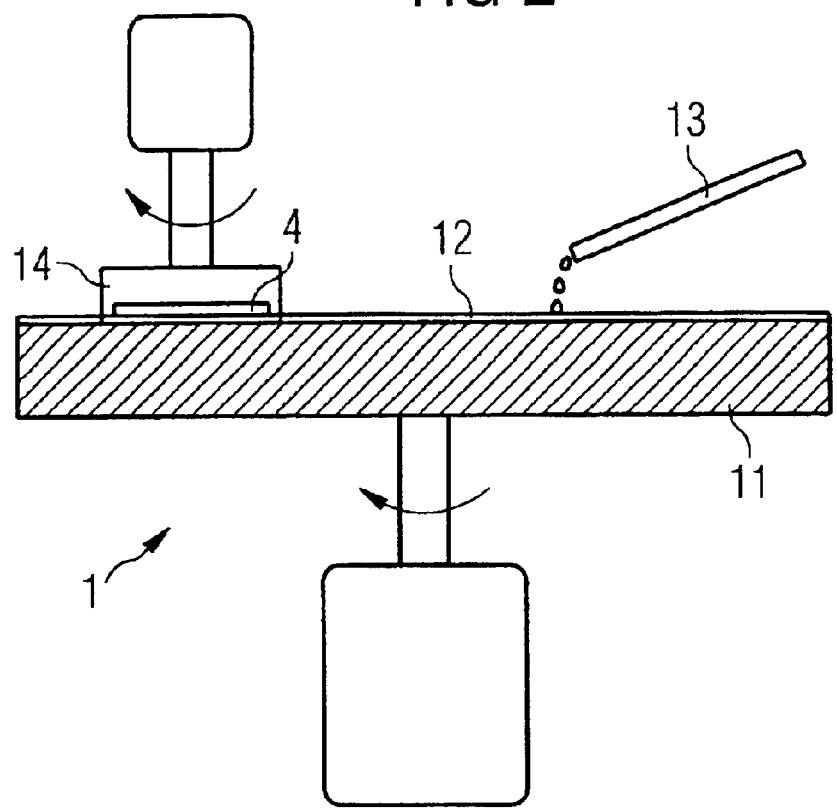
FIG. 2 is a cross-sectional view of a polisher.

Referring now to the figures of the drawing in detail and first, particularly, to FIG. 1 thereof, there is shown a chemical-mechanical polishing installation with an integrated cleaning station. The combined installation is made up of a polisher 1, a wet handler 2 and a cleaning station 3. The polisher 1, which is illustrated schematically in cross section in FIG. 2, has a rotatably disposed polishing table 11 on which there is located an elastic perforated bearing device 12, a so-called pad, which is impregnated with a polishing material, so-called slurry, via a feed device 13. A semiconductor wafer 4 which is to be processed is forced onto the pad 12 by a wafer carrier 14 of a rotatable configuration, the wafer carrier 14, with the semiconductor wafer fastened thereon, and the polishing table 11 rotating in an opposite direction. The polishing material, which is fed via the feed device 13, contains polishing grains, so-called abrasive particles, and chemically active additives, which allow selective removal of layers on the semiconductor wafer 4. The chemical-mechanical polishing serves, in particular, for leveling out trench fillings, metal plugs in contact holes and vias as well as intermediate oxides and intermetallic dielectrics.

The basic problem with chemical-mechanical polishing is that, following the polishing operation, residues of impurities, in particular slurry residues, adhering to the semiconductor surface have to be removed. The cleaning takes place in the cleaning installation 3. For this purpose, the semiconductor wafer 4 that is to be cleaned is transferred directly from the polisher 1, with the aid of the wet handler 2, into the cleaning station 3. The wet handler 2 here may contain a water bath 21 in which the semiconductor wafer which is to be cleaned is stored on an intermediate basis in order then to be displaced to the cleaning station 3. The contiguous construction of the polisher 1 and the cleaning station 3 reduces to a considerable extent the risk of defects being formed on the semiconductor surface during transfer from the polisher into the cleaning station.

The cleaning station 3 has a loading and unloading station 31, which is connected to the wet handler 2 and which generally has a robot arm in order to transfer the semiconductor wafer into a cleaning chamber 32.

Figure 3:
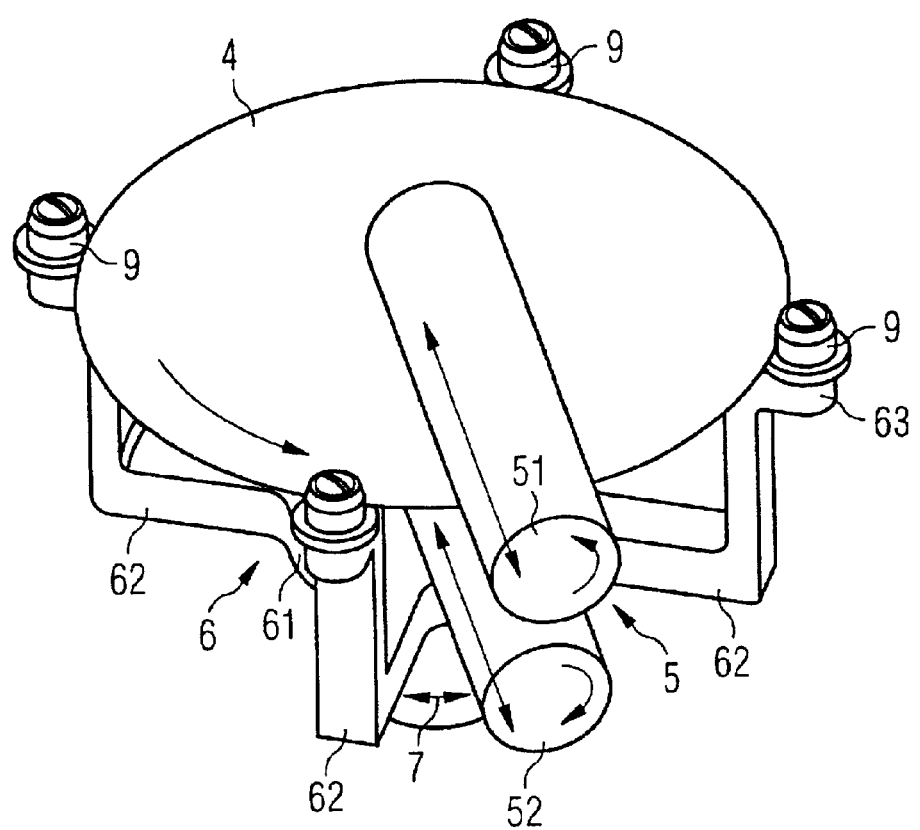
FIG. 3 is a perspective view of one embodiment of a holder according to the invention, with a semiconductor wafer placed in position, during a brush-cleaning operation.

In the cleaning chamber 32, of which the essential constituent parts are shown in a perspective illustration in FIG. 3, preferably both surfaces are freed of impurities by a brush-cleaning unit 5. The brush-cleaning unit 5 here preferably contains two cleaning brushes 51, 52, which are positioned in relation to the semiconductor wafer 4 such that the semiconductor wafer 4 is located between the two cleaning brushes 51, 52, the top cleaning brush 51 being in contact with a top side of the semiconductor wafer 4 and the bottom cleaning brush 52 being in contact with an underside of the semiconductor wafer. For cleaning the surfaces of the semiconductor wafer 4, the cleaning brushes 51, 52 are rotated in opposite directions, with the result that the rotatably mounted semiconductor wafer 4 rotates through between the two cleaning brushes 51, 52. The directions of rotation of the cleaning brushes 51, 52 and of the semiconductor wafer 4 are indicated by arrows in FIG. 3.

During the brush cleaning, the semiconductor surface is constantly flushed with a wetting-agent-containing cleaning liquid, preferably ammonia or distilled water. The cleaning liquid here may be supplied directly via the cleaning brushes 51, 52 or via a non-illustrated separate feed. Following completion of the brush cleaning, the semiconductor wafer is then freed of the cleaning liquid again by centrifugal drying at a speed of rotation of, for example, 1800 rpm.

The brush cleaning and the subsequent centrifugal drying preferably take place here, as is shown in FIG. 3, in a combined apparatus, with the result that it is possible to avoid further transfer of the semiconductor wafer. The semiconductor wafer 4 is inserted into a holder 6 in order for its position to be determined during the cleaning and drying processes. The holder 6 contains a preferably disk-shaped basic body 61, also referred to as carrier part herein below, which is seated on a schematically indicated motor block 7. With the aid of the motor block 7, the carrier part 61 can be brought, during the drying operation of the semiconductor wafer 4, to the necessary speeds of up to 1800 rpm. The two possible directions of rotation of the motor block 7 are indicated as a double arrow in FIG. 3.

Preferably four angled carrying arms 62 extend from the basic body 61 of the holder 6. The four carrying arms 62 here are preferably integrally formed symmetrically on the disk-shaped basic body 61, the basic body 61 and the carrying arms 62, in turn, preferably being formed in one piece as a rotationally symmetrical unit. The material used for producing the basic body 61 and the carrying arms 62 here is high-alloy special steel, preferably X6CrNiMoTi17-12-2. This material is distinguished by a high chemical resistance and surface quality, with the result that there is no need for any additional coating, which, in the case of abrasion, could then possibly settle as an impurity on the semiconductor wafer. The surface quality of the special steel may be improved in addition by electropolishing.

Figure 4:
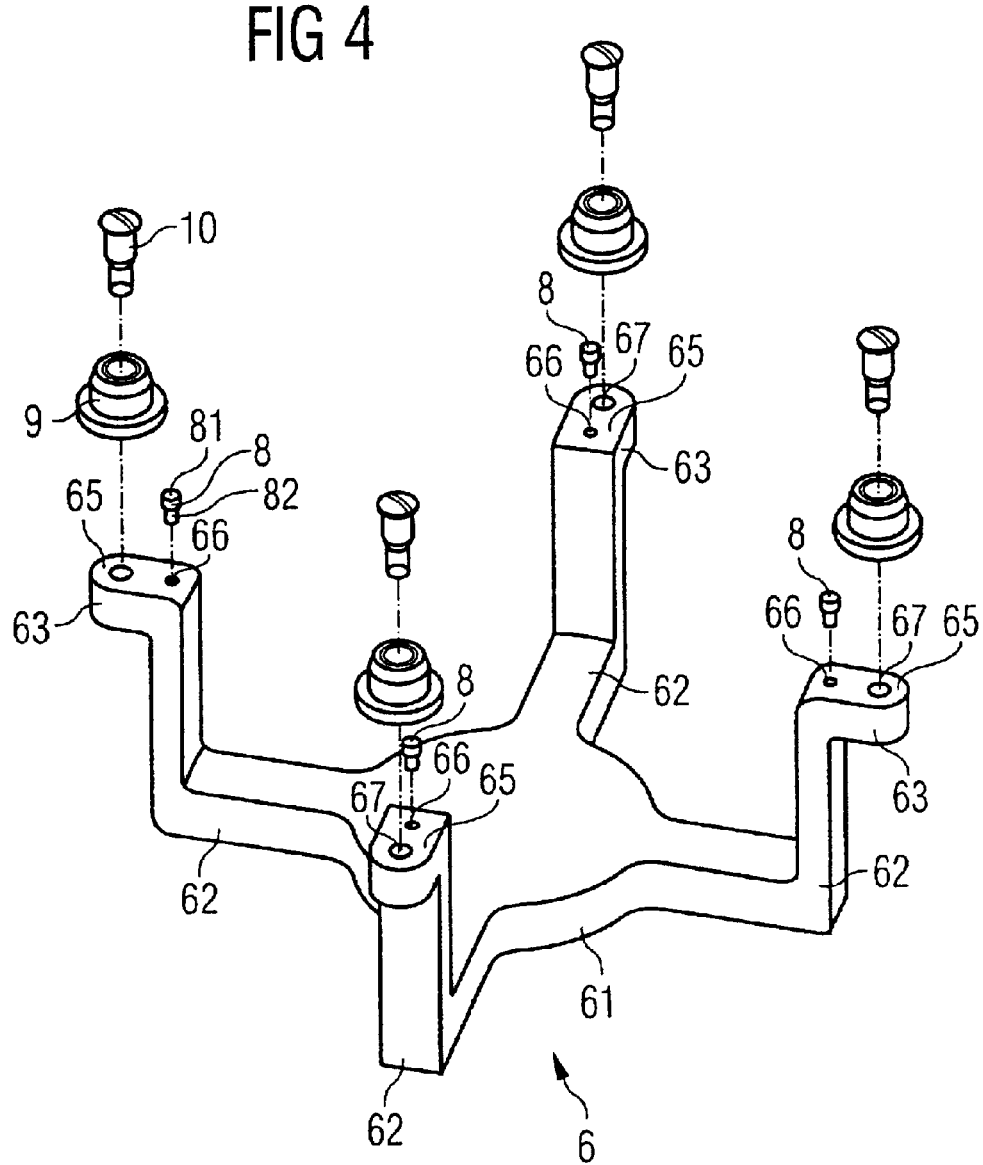
FIG. 4 is an exploded, perspective view of that embodiment of the holder according to the invention that is shown in FIG. 3.

Provided at the top ends of the angled carrying arms in each case is a radially outwardly projecting stop 63 which, as the exploded illustration of the holder in FIG. 4 shows, forms a planar set-down surface 65 in each case. A wafer-bearing device 8 and a guide roller 9 are disposed on the set-down surface 65, one behind the other in the radial direction in each case. The wafer-bearing device 8 here is made up of a bolt 82 with a disk-shaped head 81. The bolt 82, as the exploded illustration in FIG. 4 further shows, is seated in a bore 66 formed in the set-down surface 65 of the stop 63 on the carrying arm 62. The wafer-bearing device 8 is preferably produced from a chemically resistant plastic with a high surface quality, e.g. natural PTFE.

Figure 5A:
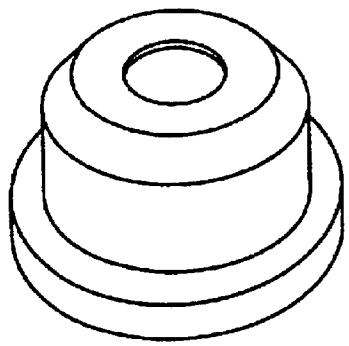
FIG. 5A is a perspective illustration of a guide roller.
Figure 5C:
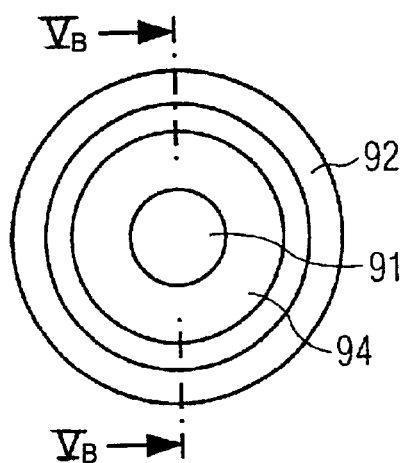
FIG. 5C is plan view of the guide roller.
Figure 5B:
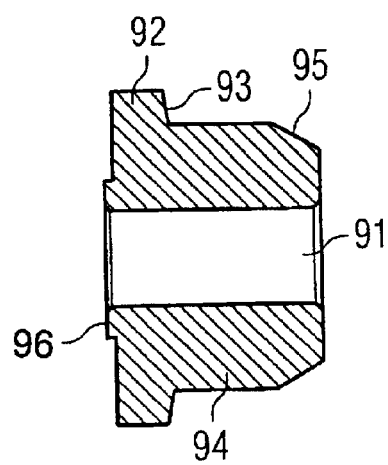
FIG. 5B is a cross-sectional view of the guide roller.

The guide roller 9, which is shown in detail in FIGS. 5A–C, is configured as a rotationally symmetrical sleeve with an inner through-bore 91. The guide roller 9 here is made up essentially of four sections. Provided at a bottom end is a widened angular collar section 92 with an essentially planar underside, on which a narrow annular extension 96, which projects by approximately 0.5 mm, is formed around the bore 91. A top side 93 of the widened collar section 92 is of a slightly conical configuration with a setting angle of 80°. The widened collar section 92 is adjoined by a longer cylindrical section 94, on which, in turn, a shorter conical tapering top section 95 is seated. The setting angle of the conical top section 95 here is preferably 30°.

A height of the disk-shaped head 81 of the wafer-bearing device 8 is coordinated with the guide roller 9 such that it is preferably approximately 1 mm lower than the height of the collar section 92 with the extension 94 of the guide roller 9. This ensures that, when the semiconductor wafer 4 butts against the top side 93 of the collar section 92 of the guide roller 9, the semiconductor wafer 4 is no longer in contact with the disk-shaped head 81 of the wafer-bearing device 8. The guide roller 9 is produced from a chemically resistant plastic with a surface quality, e.g. natural PEEK.

Figure 6:
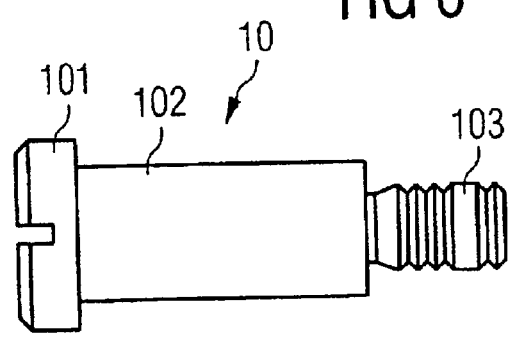
FIG. 6 is a side-elevational view of an embodiment of a retaining bolt according to the invention.

The guide roller 9 is secured rotatably on the stop 63 of the carrying arm 62 with the aid of a retaining bolt 10 configured as a pan-head screw. The retaining bolt 10, which is illustrated in detail in FIG. 6, has a widened head section 101, in which there is provided a slot in which a turning tool can engage. The widened head section 101 is adjoined by a longer pin-shaped section 102, on which, in turn, a self-securing threaded section 103 is seated. The retaining bolt 10 can be screwed in, by way of the self-securing threaded section 103, in a rear bore 67 which is provided on the set-down surface 65 of the stop 63 on the carrying arm 62 and bears a mating thread.

The front bore 66 and the rear bore 67 are preferably disposed on the set-down surface 65 of the stop 63 such that there is a spacing of at least approximately 2 mm between the disk-shaped head 81 of the wafer-bearing device 8 and the widened collar section 92 of the guide roller 9. The retaining bolt 10 is configured such that the pin-shaped section 102 is essentially of the height of the guide roller 9. In the fastened state, the guide roller 9 then slides on the pin section 102 by way of the inside of its bore 91. The guide roller 9 is secured here by the widened head section 101, which is seated on the conical top section 95 of the guide roller 9. By virtue of the reduced diameter of the top conical section 95 in the guide roller 9, the contact surface of the head section 101 of the retaining bolt 10 is small, with the result that minimal sliding friction is achieved. The sliding friction is also reduced by the narrow bottom extension 94, 96 of the guide roller 9, by which the guide roller 9 rests on the abutment surface 65 of the extension 63 on the carrying arm 62. The retaining bolt 10, like the carrying arm 62 and the basic body 61, is produced from high-alloy special steel, preferably X6CrNiMoCi17-12-2, of which the surface is additionally improved by electropolishing. The material selection results in that it is not necessary for the retaining bolt to be provided with an additional coating, which may abrade during operation of the holder and would thus result in quicker wear of the guide roller 9.

The configuration according to the invention of the holder 6 for the brush-cleaning and centrifugal-drying operations achieves high ease of maintenance since both the vertical and the horizontal positioning of the semiconductor wafer are carried out exclusively by the guide roller 9. The annularly widened collar section 92 of the guide roller 9 serves as a bearing surface for the semiconductor wafer that, in turn, is secured vertically by the adjoining cylindrical top section 94 of the guide roller 9.

The additional wafer-bearing device 8 simplify, in particular, the operation of loading the holder with the semiconductor wafer, this operation usually being carried out via a robot arm. If the robot arm does not seat the semiconductor wafer 4 in its precise position on the widened collar sections 92 of the guide rollers 9, e.g. on account of a control error, the additional wafer-bearing device 8 ensure that the semiconductor wafer 4 slides, via the widened head section 81 of the wafer-bearing device 8, in the direction of the guide rollers 9 and thus automatically positions itself on the top side 93 of the widened collar section 92 of the guide rollers. When the semiconductor wafer 4 is in the correct position, the wafer-bearing device 8 is then no longer in contact with the semiconductor wafer 4 since the latter, as has been explained above, is of slightly lesser height than the widened collar section 92 of the guide rollers 9. Mounting the guide rollers 9 rotatably on the stop 63 on the holder 6 with the aid of the pin-shaped retaining bolt 10 allows straightforward installation and removal of the guide rollers 9, it being possible for the retaining bolt 10 to be used a number of times. The self-securing thread on the retaining bolt 10 here ensures precise positioning of the guide roller 9 on the holder 6 and thus uniform rotation.

Configuring the holder 6 in one piece with the basic body 61 and the four carrying arms 62, disposed in a spider-like manner thereon, further ensures simplified production and installation, the selection of high-alloy special steel rendering any additional surface coating, which involves the risk of abrasion, unnecessary.

The features of the invention which are disclosed in the above description, the drawings and the claims may be significant both individually and in any desired combination for the purpose of realizing the invention in its various configurations.

We claim:

1. A holder for a wafer, comprising:

a carrier part;

a plurality of carrying arms extending in a spider-shaped manner from said carrier part and each having a bore formed therein;

a plurality of bolts; and a plurality of guide rollers for positioning the wafer vertically and each mounted rotatably on one of said carrying arms, each of said guide rollers having an annular collar for positioning the wafer horizontally, each of said guide rollers with said annular collar functioning as a rotationally symmetrical sleeve having a through-bore formed therein and secured in a rotatable manner on one of said carrying arms by way of one of said bolts disposed in said through-bore, each of said guide rollers having an underside with an extension resting on one of said carrying arms, said extension having an abutment surface with a diameter being smaller than a diameter of said rotationally symmetrical sleeve to achieve a reduced surface friction;

each of said bolts having a bottom bolt section with a self-securing thread for fastening in said bore on one of said carrying arms, a central bolt section for bearing said rotationally symmetrical sleeve with a sliding action, and a top bolt section with a hat-shape for positioning said rotationally symmetrical sleeve vertically.

2. The holder according to claim 1, wherein said carrier part and said plurality of carrying arms are produced in one piece as a rotationally symmetrical unit from high-alloy chemically resistant special steel with an electropolished surface.

3. The holder according to claim 1, wherein each of said guide rollers contains a top side having a further extension with an underside butting against said top bolt section, an abutment surface of said further extension having a diameter being smaller than a diameter of said rotationally symmetrical sleeve to achieve a reduced surface friction.

4. The holder according to claim 1, wherein each of said carrying arms has a top end with a horizontal set-down surface on which said guide rollers are disposed; and further comprising stop surfaces, each of said stop surfaces disposed on said set-down surface, radially in front of one of said guide rollers, and being set back, by at least 1 mm, in relation to a top side of said annular collar on each of said guide rollers.

5. An apparatus for cleaning a wafer, comprising:

a holder according to claim 1 for securing the wafer; and brushes disposed in functional relationship to said holder for cleaning at least one surface of the wafer.

* * * * *